(12) United States Patent
Lee et al.

(10) Patent No.: US 10,847,601 B2
(45) Date of Patent: Nov. 24, 2020

(54) DISPLAY APPARATUS

(71) Applicant: SAMSUNG DISPLAY CO., LTD., Yongin-si (KR)

(72) Inventors: Ju Hee Lee, Asan-si (KR); Jongwoo Park, Seongnam-si (KR); Youngtae Choi, Cheonan-si (KR); Dae Youn Cho, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 16/513,316

(22) Filed: Jul. 16, 2019

(65) Prior Publication Data

US 2020/0044008 A1 Feb. 6, 2020

(30) Foreign Application Priority Data

Jul. 31, 2018 (KR) .......................... 10-2018-0089621

(51) Int. Cl.
| | |
|---|---|
| *H01L 27/14* | (2006.01) |
| *H01L 27/32* | (2006.01) |
| *H01L 51/00* | (2006.01) |
| *H01L 27/12* | (2006.01) |

(52) U.S. Cl.
CPC ...... *H01L 27/3276* (2013.01); *H01L 27/3262* (2013.01); *H01L 27/3265* (2013.01); *H01L 51/0097* (2013.01); *H01L 27/124* (2013.01); *H01L 27/1218* (2013.01); *H01L 27/1255* (2013.01); *H01L 2251/5338* (2013.01)

(58) Field of Classification Search
CPC ............. H01L 27/3276; H01L 27/3262; H01L 27/3265
USPC ................................................ 257/40, 59, 72
See application file for complete search history.

(56) References Cited

U.S. PATENT DOCUMENTS

| | | | |
|---|---|---|---|
| 7,435,631 B2 * | 10/2008 | Yang | ................... G02F 1/13454 |
| | | | 257/E27.111 |
| 9,842,864 B2 * | 12/2017 | Kim | .................. G02F 1/136227 |
| 2016/0204180 A1 * | 7/2016 | Lee | ..................... H01L 27/3241 |
| | | | 438/23 |

FOREIGN PATENT DOCUMENTS

| | | |
|---|---|---|
| KR | 10-2016-0002337 | 1/2016 |
| KR | 10-2017-0064125 | 6/2017 |

* cited by examiner

*Primary Examiner* — Tan N Tran
(74) *Attorney, Agent, or Firm* — Lewis Roca Rothgerber Christie LLP

(57) ABSTRACT

A display apparatus includes a substrate; a lower conductive layer including a protective pattern and an auxiliary conductive pattern on the substrate; a buffer layer on the lower conductive layer; an active pattern on the buffer layer and overlapping the protective pattern; a first insulation layer on the active pattern; and a first conductive layer on the first insulation layer, the first conductive layer including a gate electrode overlapping the active pattern and a load matching line overlapping the auxiliary conductive pattern.

20 Claims, 10 Drawing Sheets

DISPLAY APPARATUS

CROSS-REFERENCE TO RELATED APPLICATION

This application claims priority to and the benefit of Korean Patent Application No. 10-2018-0089621, filed on Jul. 31, 2018 in the Korean Intellectual Property Office, the entire content of which is herein incorporated by reference.

BACKGROUND

1. Field

Exemplary embodiments of the inventive concept relate to a display apparatus.

2. Description of the Related Art

Recently, a display apparatus having light weight and small size has been manufactured. A cathode ray tube (CRT) display apparatus has been used due to a performance and a competitive price. However the CRT display apparatus has a weakness with a size or portability. Therefore, a display apparatus such as a plasma display apparatus, a liquid crystal display apparatus, and an organic light emitting display apparatus has been highly regarded due to small size, light weight and low power consumption.

A display apparatus having a display area which has different size of areas beyond a simply rectangular shape has been developed. However, there has been found a problem that luminance deviates due to structural causes, manufacturing causes, etc., for each of the areas having different sizes, and display quality is deteriorated.

SUMMARY

According to an aspect of one or more exemplary embodiments of the inventive concept, a display apparatus having areas which have different size of areas is has improved manufacturing yield thereof and improved luminance uniformity irrespective of the areas.

According to one or more exemplary embodiments of the inventive concept, a display apparatus includes a substrate; a lower conductive layer comprising a protective pattern and an auxiliary conductive pattern on the substrate; a buffer layer on the lower conductive layer; an active pattern on the buffer layer and overlapping the protective pattern; a first insulation layer on the active pattern; and a first conductive layer on the first insulation layer, the first conductive layer comprising a gate electrode overlapping the active pattern and a load matching line overlapping the auxiliary conductive pattern.

In an exemplary embodiment, the display apparatus further includes an interlayer insulation layer on the first conductive layer, and a second conductive layer on the interlayer insulation layer, the second conductive layer comprising a load matching electrode which overlaps the load matching line.

In an exemplary embodiment, the first conductive layer may further include a connecting line spaced apart from the load matching line.

In an exemplary embodiment, the connecting line may be electrically connected to the auxiliary conductive pattern through a first contact hole formed through the first insulation layer and the buffer layer, and electrically connected to the load matching electrode through a second contact hole formed through the interlayer insulation layer.

In an exemplary embodiment, the first contact hole and the second contact hole may not overlap each other.

In an exemplary embodiment, the substrate may include a first pixel area, a second pixel area connected to the first pixel area and having a smaller size than the first pixel area, a first peripheral area which is a non-display area and is adjacent to the first pixel area, and a second peripheral area which is a non-display area and is adjacent to the second pixel area. The load matching line may comprise a plurality of load matching lines corresponding to gate lines in the second pixel area. The connecting line may comprise a plurality of connecting lines.

In an exemplary embodiment, the auxiliary conductive pattern, the load matching line, and layers therebetween may form a first load matching capacitor. The load matching line, the load matching electrode, and layers therebetween may form a second load matching capacitor.

In an exemplary embodiment, the first conductive layer may further include a first storage electrode. The display apparatus may further include a second insulation layer on the first conductive layer, and a third conductive layer on the second insulation layer, the third conductive layer including a second storage electrode which overlaps the first storage electrode.

In an exemplary embodiment, the display apparatus may further include a third insulation layer on the first conductive layer, and a light emitting structure on the third insulation layer, the light emitting structure including a first electrode, a second electrode facing the first electrode, and a light emitting layer between the first electrode and the second electrode.

In an exemplary embodiment, the second electrode may overlap the load matching electrode.

In an exemplary embodiment, a second power source (ELVSS) may be applied to the second electrode. A first power source (ELVDD) may be applied to the auxiliary conductive pattern and the load matching electrode.

In an exemplary embodiment, the substrate may include a first pixel area, a second pixel area connected to the first pixel area and having a smaller size than the first pixel area, a first peripheral area which is a non-display area and is adjacent to the first pixel area, and a second peripheral area which is a non-display area and is adjacent to the second pixel area. The auxiliary conductive pattern and the load matching line may be in the second peripheral area. The active pattern and the gate electrode may constitute a thin film transistor. The thin film transistor may be in the second pixel area.

In an exemplary embodiment, the second pixel area may be disposed adjacent to an upper side of the first pixel area, and the second peripheral area may include an upper second peripheral area located adjacent to an upper side of the second pixel area. The load matching line may be in the upper second peripheral area.

In an exemplary embodiment, the first conductive layer may further include a gate line. The load matching line may be physically connected to the gate line.

In an exemplary embodiment, the substrate may further include a third pixel area which is spaced apart from the second pixel area and connected to the first pixel area and has a smaller size than the first pixel area, and a third peripheral area which is a non-display area adjacent to the third pixel area. A notch may be formed between the second pixel area and the third pixel area.

In an exemplary embodiment, the substrate may include at least one polyimide layer, and at least one barrier layer.

In an exemplary embodiment, the lower conductive layer may further include molybdenum (Mo).

In an exemplary embodiment, the auxiliary conductive pattern may comprise a slit.

According to one or more exemplary embodiments of the inventive concept, a display apparatus includes a first area, a second area adjacent to the first area and having a smaller size than the first area, and a third area adjacent to the first area and spaced apart from the second area to form a notch between the second area and the third area. The display apparatus includes a gate line in the second area; a first load matching capacitor electrically connected to the gate line; and a second load matching capacitor electrically connected to the gate line and overlapping the first load matching capacitor.

In an exemplary embodiment, the display apparatus further include a substrate, an auxiliary conductive pattern on the substrate, a load matching line on the auxiliary conductive pattern and formed from a same layer as the gate line, and a load matching electrode on the load matching line. The first load matching capacitor may be formed by the auxiliary conductive pattern, the load matching line, and insulation layers therebetween. The second load matching capacitor may be formed by the load matching line, the load matching electrode, and insulation layers therebetween.

According to one or more exemplary embodiments of the present inventive concept, a display apparatus includes a substrate; a lower conductive layer comprising a protective pattern and an auxiliary conductive pattern on the substrate, a buffer layer on the lower conductive layer, an active pattern on the buffer layer and overlapping the protective pattern, a first insulation layer on the active pattern, and a first conductive pattern on the first insulation layer, the first conductive pattern comprising a gate electrode overlapping the active pattern and a load matching line overlapping the auxiliary conductive pattern. Accordingly, since the scan lines and the load matching lines are physically connected and are not connected to each other by contact holes or the like, in the manufacturing process, usage, and the like of the display apparatus, it is possible to provide a structure that minimizes or reduces a variation of characteristics of the thin film transistor and damage caused by static electricity flowing into the active pattern through the contact holes.

In addition, since the load matching capacitor is formed by using the lower conductive layer, a possibility of short circuiting with the gate conductive layer is reduced as compared with a case in which the active layer is used for forming the load matching capacitor.

In addition, since the thin film transistor can be protected by the protective pattern, the display quality of the display apparatus can be improved.

It is to be understood that both the foregoing general description and the following detailed description are exemplary and explanatory and are intended to provide further explanation of the invention as claimed.

BRIEF DESCRIPTION OF THE DRAWINGS

The above and other features of the inventive concept will become more apparent by describing in further detail some exemplary embodiments thereof with reference to the accompanying drawings, in which.

DETAILED DESCRIPTION

Figure 1:
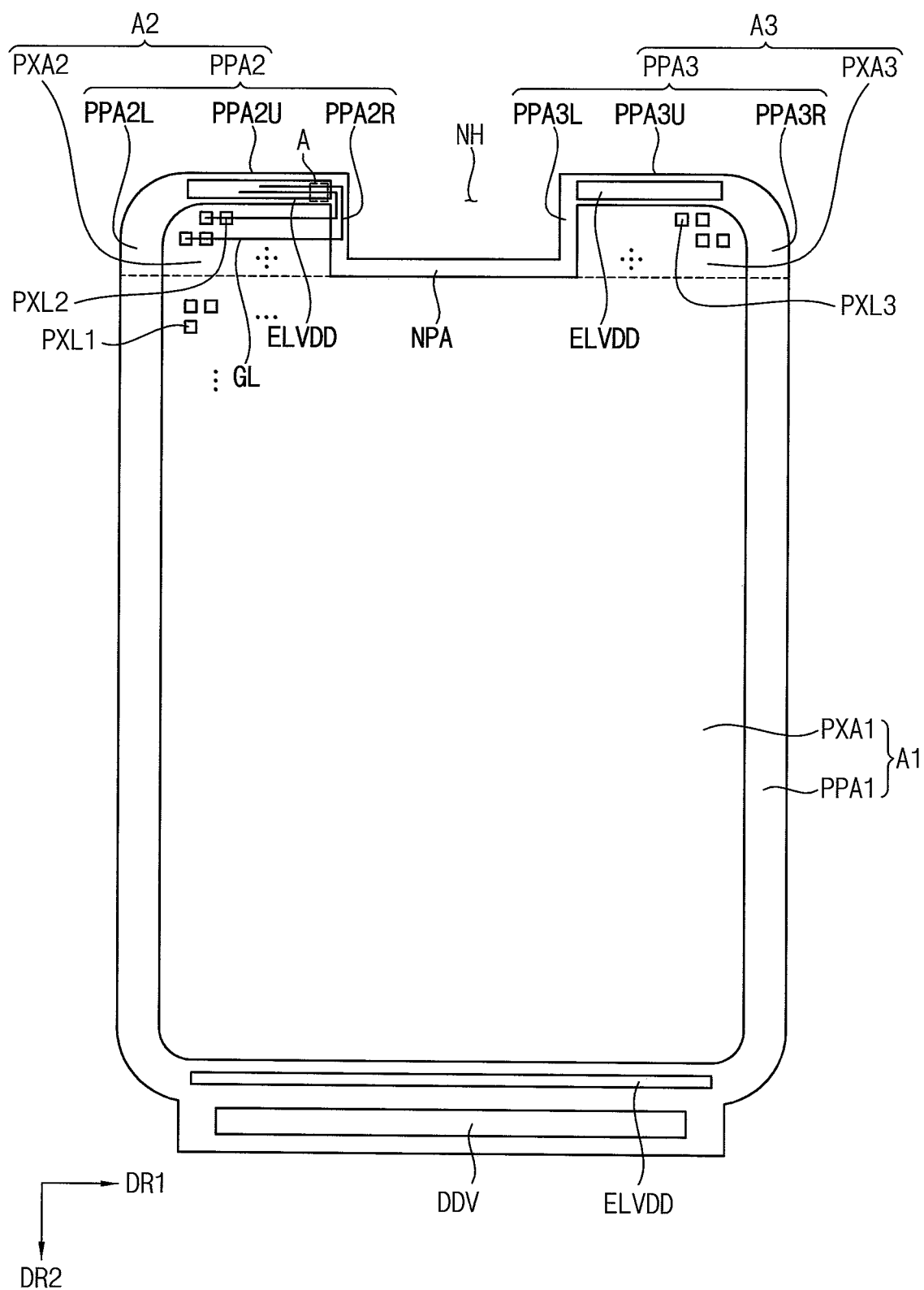
FIG. 1 is a plan view illustrating a display apparatus according to an exemplary embodiment of the inventive concept.

Herein, the inventive concept will be explained in further detail with reference to some exemplary embodiments and the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Expressions such as "at least one of," when preceding a list of elements, modify the entire list of elements and do not modify the individual elements of the list.

It is to be understood that, although the terms "first," "second," etc. may be used herein to describe various components, these components should not be limited by these terms. These terms are used to distinguish one component from another.

As used herein, the singular forms "a," "an," and "the" are intended to include the plural forms as well, unless the context clearly indicates otherwise.

It is to be understood that the terms "comprise," "include," and "have" used herein specify the presence of stated features or components, but do not preclude the presence or addition of one or more other features or components.

Sizes of components in the drawings may be exaggerated for convenience of description. In other words, since the sizes and thicknesses of components in the drawings may be arbitrarily illustrated for convenience of description, the following embodiments are not limited thereto.

When a certain embodiment may be implemented differently, a particular process order may be performed differently from the described order. For example, two consecutively described processes may be performed substantially at the same time or performed in an order opposite to the described order.

It is to be understood that when a layer, region, or component is referred to as being "connected to" another layer, region, or component, it may be directly connected to the other layer, region, or component or may be indirectly connected to the other layer, region, or component with one or more intervening layers, regions, or components interposed therebetween. For example, it is to be understood that when a layer, region, or component is referred to as being "electrically connected to" another layer, region, or component, it may be directly electrically connected to the other layer, region, or component or may be indirectly electrically connected to the other layer, region, or component with one or more intervening layers, regions, or components interposed therebetween.

Spatially relative terms, such as "beneath," "below," "lower," "above," "upper," and the like, may be used herein for ease of description to describe one element or feature's relationship to another element(s) or feature(s) as illustrated in the figures. It is to be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

Unless otherwise defined, all terms (including technical and scientific terms) used herein have the same meaning as commonly understood by one of ordinary skill in the art to which example embodiments of the inventive concept belong. It is to be further understood that terms, such as those defined in commonly-used dictionaries, should be interpreted as having a meaning that is consistent with their meaning in the context of the relevant art and will not be interpreted in an idealized or overly formal sense unless expressly so defined herein.

FIG. 1 is a plan view illustrating a display apparatus according to an exemplary embodiment of the inventive concept.

Referring to FIG. 1, the display apparatus may include a substrate 100, pixels PXL1, PXL2, and PXL3 (herein referred to as PXL) provided on the substrate 100, a driving part (not shown) provided on the substrate 100 and driving the pixels, a power supply unit for supplying power to the pixels, and a wiring part connecting the pixels to the driving part.

The substrate 100 may include a plurality of areas. At least two of the areas may have different sizes. For example, the substrate 100 may include three areas, i.e., first to third areas A1, A2, and A3.

Each of the first to third areas A1, A2, and A3 may have various shapes. For example, each of the first to third areas A1, A2, and A3 may have a shape of any of a closed polygon including a straight side, a circle, an oval, or the like including a curved side, and semi-elliptical or semi-elliptical including a straight side and a curved side.

In some embodiments, each of the first to third areas A1, A2, and A3 may have a roughly rectangular shape, and a corner portion may have a rounded shape.

The first to third areas A1, A2, and A3 may have pixel areas PXA1, PXA2, and PXA3 (herein referred to as PXA) and peripheral areas PPA1, PPA2, and PPA3 (herein referred to as PPA), respectively. The pixel areas PXA are areas where pixels for displaying an image are provided. Each pixel will be described later.

In some embodiments, each of the first through third pixel areas PXA1, PXA2, and PXA3 may correspond to the shape of the first through third areas A1, A2, and A3.

The peripheral areas PPA are areas in which the pixels are not provided, and are non-display areas in which no image is displayed. The driving part for driving the pixels, the power supply unit for applying power to the pixels, and the wiring part for connecting the pixels to the driving part may be provided in the peripheral areas PPA. The peripheral areas PPA may correspond to a bezel of the display apparatus, and a width of the bezel can be determined according to a width of the peripheral area.

The first to third areas A1, A2, and A3 will be described herein.

The first area A1 may have a largest area among the first to third areas A1, A2, and A3. The first area A1 may have a first pixel area PXA1 which is a display area, and a first peripheral area PPA1 which surrounds at least a portion of the first pixel area PXA1 and is a non-display area.

The first pixel area PXA1 may be provided in a shape corresponding to a shape of the first area A1.

The first peripheral area PPA1 may be provided on at least one side of the first pixel area PXA1. In some example embodiments, the first peripheral area PPA1 may surround a boundary of the first pixel area PXA1 and may be provided except for the second area A2 and the third area A3 which will be described later. In some embodiments, the first peripheral area PPA1 may include a horizontal portion extending in a width direction and a vertical portion extending in a longitudinal direction. The vertical portion of the first peripheral area PPA1 may be provided as a pair of spaced apart portions along the width direction of the first pixel area PXA1.

The second area A2 may have a smaller size than the first area A1. The second area A2 may have a second pixel area PXA2 which is a display area, and a second peripheral area PPA2 which surrounds at least a portion of the second pixel area PXA2 and is a non-display area. The second peripheral area PPA2 may include an upper second peripheral area PPA2U disposed on an upper side of the second pixel area PXA2 (opposite direction to a second direction DR2), and a left second peripheral area PPA2L and a right second peripheral area PPA2R which are disposed at a left side and a right side of the second pixel area PXA2 (a first direction DR1 and an opposite direction thereof), respectively.

The second pixel area PXA2 may be provided in a shape corresponding to a shape of the second area A2. The second pixel area PXA2 may be provided as a protrusion from the first pixel area PXA1 and may be directly connected to the first pixel area PXA1. In other words, an edge of the second pixel area PXA2 which is closest to the first pixel area PXA1 may coincide with an edge of the first pixel area PXA1.

The second peripheral area PPA2 may be provided on at least one side of the second pixel area PXA2. In some example embodiments, the second peripheral area PPA2 may surround the second pixel area PXA2 and may not be provided where the first pixel area PXA1 and the second pixel area PXA2 are connected. In some example embodiments, the second peripheral area PPA2 may also include a portion PPA2U extending in the width direction and portions PPA2L and PPA2R extending in the longitudinal direction.

The third area A3 may have a size smaller than the first area A1. In an embodiment, the third area A3 may have a same size as the second area A2. The third area A3 may have a third pixel area PXA3 in which an image is displayed and a third peripheral area PPA3 which surrounds at least a portion of the third pixel area PXA3 and is a non-display area. The third peripheral area PPA3 may also include an upper third peripheral area PPA3U disposed on an upper side of the third pixel area PXA3 (in an opposite direction to the second direction DR2), and a right third peripheral area PPA3R and a left third peripheral area PPA3L disposed on the right and left sides (the first direction DR1 and an opposite direction thereof) of the third pixel area PXA3, like the second peripheral area PPA2.

The third pixel area PXA3 may be provided in a shape corresponding to a shape of the third area A3.

The third pixel area PXA3 may be provided as a protrusion from the first pixel area PXA1 and may be directly connected to the first pixel area PXA1. In other words, an edge of the third pixel region PXA3 closest to the first pixel region PXA1 may coincide with an edge of the first pixel region PXA1.

The third peripheral area PPA3 may be provided on at least one side of the third pixel area PXA3. In some example embodiments, the third peripheral area PPA3 may surround the third pixel area PXA3 and may not be provided where the first pixel area PXA1 and the third pixel area PXA3 are connected. In some example embodiments, the third peripheral area PPA3 may also include a portion PPA3U extending in the width direction and portions PPA3L and PPA3R extending in the longitudinal direction.

In some example embodiments, based on a centerline of the first area A1, the third area A3 may have a shape that is line-symmetric with the second area A2. In this case, the arrangement relationship of each component provided in the third area A3 may be substantially the same as that in the second area A2 except for some wirings.

Thus, the substrate 100 may have a shape in which the second area A2 and the third area A3 protrude from the first area A1 in the opposite direction to the second direction DR2. In an embodiment, the second area A2 and the third area A3 are spaced apart, and the substrate 100 may have a recessed shape between the second area A2 and the third area A3. Thus, the substrate 100 may have a notch NH which is disposed between the second area A2 and the third area A3.

In some example embodiments, the left vertical portion and the right vertical portion of the first peripheral area PPA1 may be connected to the left second peripheral area PPA2L of the second peripheral area PPA2 and the right second peripheral area PPA3R of the third peripheral area PPA3, respectively.

In some example embodiments, the second peripheral area PPA2 and the third peripheral area PPA3 may be connected through a notch peripheral area NPA. For example, the notch peripheral area NPA may be disposed between the second pixel area PXA2 and the third pixel area PXA3 to connect the second peripheral area PPA2 to the third peripheral area PPA3. Thus, the notch peripheral area NPA may be provided on a side of the first pixel area PXA1 between the second area A2 and the third area A3.

The pixels may be provided in the pixel areas PXA on the substrate 100, that is, in the first to third pixel areas PXA1, PXA2, and PXA3. Each pixel may be provided as a minimum unit for displaying an image in plural. The pixels may include a display element emitting color light. For example, the display element may be a liquid crystal display device (LCD), an electrophoretic display device (EPD device), an electrowetting display device (EWD device), or an organic light emitting display device (OLED device). In the following, for convenience of explanation, the organic light emitting display device will be described as an example of the display element.

Each pixel may emit one of red, green, and blue colors, but is not limited thereto. For example, each pixel may emit colors such as cyan, magenta, yellow, and white.

The pixels may include first pixels PXL1 arranged in the first pixel area PXA1, second pixels PXL2 arranged in a second pixel area PXA2, and third pixels PXL3 arranged in the third pixel area PXA3. In some example embodiments, a plurality of first to third pixels PXL1, PXL2, and PXL3 may be provided in a matrix form along a row extending in the first direction DR1 and a column extending in the second direction DR2. However, the arrangement form of the first through third pixels PXL1, PXL2, and PXL3 is not particularly limited, and may be arranged in any of various forms. For example, the first pixels PXL1 may be arranged such that the first direction DR1 is a row direction, but the second pixels PXL2 may be arranged in another direction other than the first direction DR1; for example, an oblique direction to the first direction DR1 may be a row direction of the second pixels PXL2. It should be noted that the third pixels PXL3 may be arranged in the same or different directions from the first pixels PXL1 and/or the second pixels PXL2. Alternatively, in some example embodiments, the row direction may be the second direction DR2, and the column direction may be the first direction DR1.

In the second area A2 and the third area A3, the number of the second pixels PXL2 and the number of the third pixels PXL3 may vary depending on the row. For example, in the second area A2 and the third area A3, the number of the second pixels PXL2 and the number of the third pixels PXL3 arranged in the row corresponding to a rounded corner may be smaller than the number of the second pixels PXL2 and the number of the third pixels PXL3 arranged in the row corresponding to a corner formed by straight lines. In addition, the number of the second pixels PXL2 and the number of the third pixels PXL3 arranged in the row can be reduced as the row length is shortened.

The driving part may provide a signal to each pixel through the wiring part, thereby controlling the driving of each pixel.

In an embodiment, the driving part may include scan drivers (not shown) for providing a scan signal to each pixel along a scan line, light emitting drivers (not shown) for providing a light emission control signal to each pixel along an emission control line, a data driver DDV for supplying a data signal to each pixel along a data line, and a timing controller (not shown). The timing controller may control the scan driver, the light emitting driver, and the data driver DDV.

In some example embodiments, the scan drivers may include a first scan driver (SDV1 of FIG. 2) connected to the first pixels PXL1, a second scan driver (SDV2 of FIG. 2) connected to the second pixels PXL2, and a third scan driver (SDV3 of FIG. 2) connected to the third pixels PXL3. In some example embodiments, the light emitting drivers may include a first light emitting driver (EDV1 of FIG. 2) connected to the first pixels PXL1, a second light emitting driver (EDV2 of FIG. 2) connected to the second pixels PXL2, and a third light emitting driver (EDV3 of FIG. 3) connected to the third pixels PXL3.

The first scan driver SDV1 may be disposed on the vertical portion of the first peripheral area PPA1. Since the vertical portion of the first peripheral area PPA1 is provided as a pair of spaced apart portions along the width direction of the first pixel area PXA1, the first scan driver SDV1 may be disposed on at least one of the vertical portions of the first peripheral area PPA1. The first scan driver SDV1 may be extended along the length of the first peripheral area PPA1.

In a similar manner, the second scan driver SDV2 may be disposed in the second peripheral area PPA2, and the third scan driver SDV3 may be disposed in the third peripheral area PPA3.

In some example embodiments, the scan drivers may be mounted directly on the substrate 100. When the scan drivers are directly mounted on the substrate 100, they may be formed together in a process of forming the pixels. However, a position and a method of providing the scan driver are not limited thereto. For example, the scan driver may be formed on a separate chip and provided on the substrate 100 in a form of a chip-on-glass, or may be mounted on a printed circuit board and connected to the substrate 100 via a connecting member.

The first light emitting driver EDV1 may also be disposed on the vertical portion of the first peripheral area PPA1, similar to the first scan driver SDV1. The first light emitting driver EDV1 may be disposed on at least one of the vertical portions of the first peripheral area PPA1. The first light emitting driver EDV1 may extend along the longitudinal direction of the first peripheral area PPA1.

In a similar manner, the second light emitting driver EDV2 may be disposed in the second peripheral area PPA2, and the third light emitting driver EDV3 may be disposed in the third peripheral area PPA3.

In some example embodiments, the light emitting drivers may be mounted directly on the substrate 100. When the light emitting drivers are directly mounted on the substrate 100, they may be formed together in a process of forming the pixels. However, a position and a method of providing the light emitting drivers are not limited thereto. For example, the light emitting drivers may be formed on a separate chip and provided on the substrate 100 in a form of a chip-on-glass, or may be mounted on a printed circuit board and connected to the substrate 100 via a connecting member.

In some example embodiments, the scan driver and the light emitting driver may be disposed adjacent to each other and may be formed on only one of the vertical portions of the peripheral regions PPA. However, the present invention is not limited thereto. The arrangement of the scan drivers and the light emission drivers can be changed in various ways.

The data driver DDV may be disposed on the first peripheral area PPA1. In particular, the data driver DDV may be disposed on the horizontal portion of the first peripheral area PPA1. The data driver DDV may be extended along the width direction of the first peripheral area PPA1.

In some example embodiments, positions of the scan drivers, the light emitting drivers, and/or the data driver DDV may be varied.

The timing controller (not shown) may be connected to the first through third scan drivers SDV1, SDV2, and SDV3, the first through third light emitting drivers EDV1, EDV2, and EDV3, and the data driver DDV and through wirings, and positions thereof are not particularly limited. For example, the timing controller may be mounted on a printed circuit board, and may be connected to the first to third scan drivers SDV1, SDV2, SDV3, the first to third light emitting drivers EDV1, EDV2, EDV3, and the data driver DDV through a flexible circuit board. The printed circuit board may be disposed at any of various positions, such as one side of the substrate 100, or a rear side of the substrate 100.

The power supplying unit may include at least one power supply line ELVDD and ELVSS. For example, the power supply unit may include a first power supply line to which the first power supply voltage ELVDD is applied, and a second power supply line (not shown) to which the second power supply voltage ELVSS is applied. The first power supply line ELVDD and the second power supply line may supply power source to the first pixel PXL1, the second pixel PXL2, and the third pixel PXL3.

The first power supply line ELVDD may be arranged to correspond to one side of the first pixel area PXA1. The first power supply line ELVDD may be arranged to correspond to one side of the first pixel area PXA1. For example, the first power supply line ELVDD may be located in an area where the data driver DDV of the first peripheral area PPA1 is disposed. Also, the first power supply line ELVDD may extend in the width direction of the first pixel area PXA1.

In addition, the first power supply line ELVDD may be arranged to extend along the first direction DR1 in the upper second peripheral area PPA2U and the upper third peripheral area PPA3U. A portion of the first power supply line ELVDD disposed in the upper second peripheral area PPA2U and the upper third peripheral area PPA3U may work as a load matching electrode (refer to LCE in FIG. 6).

In the above example, it is assumed that the first power supply line ELVDD is arranged corresponding to one side of the first pixel area PXA1 of the first peripheral area PPA1, and the second power supply line ELVSS is arranged in the remaining peripheral areas. However, the present invention is not limited thereto. For example, the first power supply line ELVDD and the second power supply line may be arranged to surround the first pixel area PXA1, the second pixel area PXA2, and the third pixel area PXA3.

The first power source applied to the first power supply line ELVDD may be higher than the second power source applied to the second power supply line.

Here, a scan line GL disposed in the second pixel area PXA2 may have different electrical characteristics due to structural differences from scan lines disposed in the first pixel area PXA1. Accordingly, a load deviation of the scan lines may occur. To compensate for this, a load matching line LML may be formed in the second peripheral area PPA2 and connected to the scan line GL of the second pixel area PXA2. Although not shown, a scan line arranged in the third pixel region PXA3 may have a structure similar to the scan line GL and the load matching line LML.

For example, the scan line GL may be formed of a first gate conductive layer (refer to the description of FIG. 6) and extend in the first direction DR1 through the right second peripheral region PPA2R to the load matching line LML in the upper second peripheral region PPA2U. Although two scan lines and two load matching lines are shown in the drawings, a plurality of load matching lines corresponding to the scan lines of the second pixel area PXA2 may be formed.

Although the load matching line is described only for the scan line in the drawing, a load matching line of a similar concept may be applied to a line crossing the first direction, for example, an emission control line.

Figure 2:
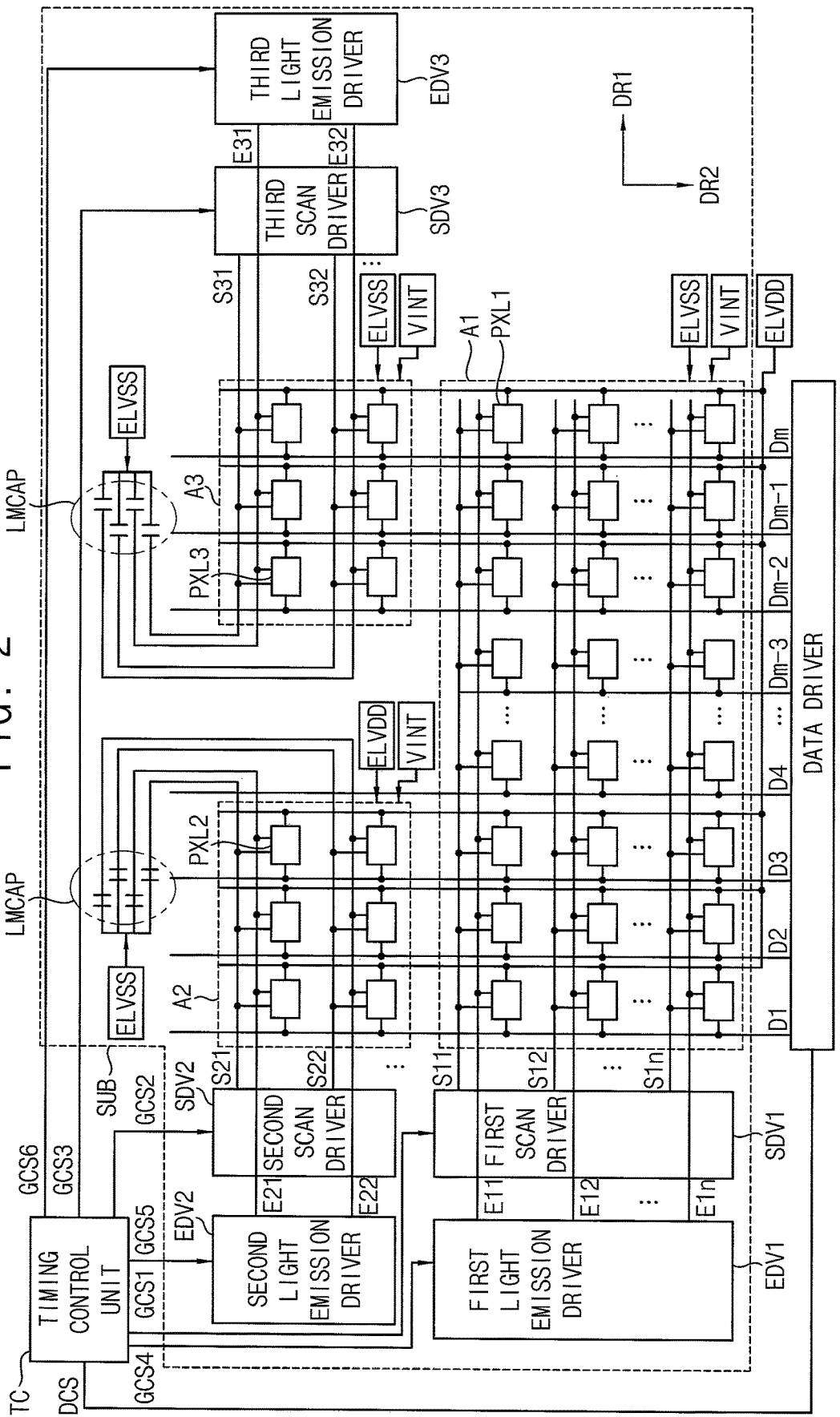
FIG. 2 is a block diagram of pixels and a driver according to an example embodiment of the inventive concept.

FIG. 2 is a block diagram of pixels and a driver according to an example embodiment of the inventive concept.

Referring to FIGS. 1 and 2, the display apparatus may include pixels, a driving part, and a wiring part.

The pixels may include first to third pixels PXL1, PXL2, and PXL3. The driving part may include first to third scan drivers SDV1, SDV2, and SDV3, first to third light emitting drivers EDV1, EDV2, and EDV3, a data driver DDV, and a timing controller TC. In FIG. 2, positions of the first through third scan drivers SDV1, SDV2, and SDV3, the first through third light emitting drivers EDV1, EDV2, and EDV3, the data driver DDV, and the timing controller TC are set for the sake of convenience of explanation, and, when a display apparatus is implemented, may be arranged at other positions in the display apparatus. For example, the data driver DDV may be disposed closer to the first area A1 than the second area A2 and the third area A3, but is not limited thereto.

The wiring part may provide signals of the driving part to each pixel, and may include scan lines, data lines, and emission control lines, power supply lines, and initialization power supply lines (not shown).

The scan lines may include first to third scan lines S11 to S1n, S21 and S22, and S31 and S32 respectively connected to the first to third pixels PXL1, PXL2, and PXL3. The emission control lines may include first to third emission control lines E11 to E1n, E21 and E22, and E31 and E32 connected to the first to third pixels PXL1, PXL2, and PXL3, respectively. Data lines D1 to Dm and the power source line may be connected to the first to third pixels PXL1, PXL2, and PXL3.

The first pixels PXL1 may be located in the first pixel area PXA1. The first pixels PXL1 are connected to the first scan lines S11 to S1n, the first light emission control lines E11 to E1n, and the data lines D1 to Dm. The first pixels PXL are provided with a data signal from the data lines D1 to Dm when a scan signal is supplied from the first scan lines S11 to S1n. The first pixels PXL1 that receive the data signal control the amount of current flowing from the first power source ELVDD to the second power source ELVSS via an organic light emitting diode (not shown).

The second pixels PXL2 are disposed in the second pixel area PXA2. The second pixels PXL2 are connected to the second scan lines S21, S22, the second light emission control lines E21, E22, and the data lines D1 to D3. The second pixels PXL2 are provided with a data signal from the data lines D1 to D3 when a scan signal is supplied from the second scan lines S21, S22 and the third scan lines S31, S32. The second pixels PXL2 that receive the data signal control the amount of current flowing from the first power source ELVDD to the second power source ELVSS via the organic light emitting diode.

Additionally, although it is illustrated in FIG. 2 that six second pixels PXL2 are disposed in the second pixel area PXA2 by two second scan lines S21, S22, two second light emission control lines E21, E22, and three data lines D1 to D3, there is no limitation thereto. That is, a plurality of second pixels PXL2 are arranged to correspond to the size of the second pixel area PXA2, and the number of the second scan lines, the second light emission control lines, and data lines may be set variously to correspond to the second pixels PXL2.

The third pixels PXL3 are disposed in the third pixel area PXA3 and are connected to the third scan lines S31, S32, the third light emission control lines E31, E32, and the data lines Dm-2 to Dm. The third pixels PXL3 are provided with a data signal from the data lines Dm-2 to Dm when a scan signal is supplied from the third scan lines S31, S32 and the second scan lines S21, S22. The third pixels PXL3 that receive the data signal control the amount of current flowing from the first power source ELVDD to the second power source ELVSS via the organic light emitting diode.

In addition, although it is illustrated in FIG. 2 that six third pixels PXL3 are disposed in the third pixel area PXA3 by two third scan lines S31, S32, two third light emission control lines E31, E32 and three data lines Dm-2 to Dm, there is no limitation thereto. That is, the plurality of third pixels PXL3 are arranged to correspond to the size of the third pixel area PXA3, and the number of the third scan lines, the third light emission control lines, and the data lines may be set variously to correspond to the third pixels PXL3.

The first scan driver SDV1 supplies a scan signal to the first scan lines S11 to S1n in response to a first gate control signal GCS1 from the timing control unit TC. For example, the first scan driver SDV1 may supply the scan signal to the first scan lines S11 to S1n sequentially. When the scan signal is sequentially supplied to the first scan lines S11 to S1n, the first pixels PXL1 are sequentially selected in horizontal line units.

The second scan driver SDV2 supplies a scan signal to the second scan lines S21, S22 in response to a second gate control signal GCS2 from the timing control unit TC. Here, the scan signal supplied to the second scan lines S21, S22 is supplied to the third scan lines S31, S32 via the scan line connecting parts. The second scan driver SDV2 may supply the scan signal to the second scan lines S21, S22 sequentially. When the scan signal is supplied to the second scan lines S21, S22 sequentially, the second pixels PXL2 and the third pixels PXL3 are selected sequentially in horizontal line units.

The third scan driver SDV3 supplies a scan signal to the third scan lines S31, S32 in response to a third gate control signal GCS3 from the timing control unit TC. Here, the scan signal supplied to the third scan lines S31, S32 is supplied to the second scan lines S21, S22 via the scan line connecting part. The third scan driver SDV3 may supply the scan signal sequentially to the third scan lines S31, S32. When the scan signal is supplied to the third scan lines S31, S32 sequentially, the second pixels PXL2 and the third pixels PXL3 are selected sequentially in horizontal line units.

In an embodiment, since the second scan lines S21, S22 and the third scan lines S31, S32 are electrically accessed by the scan line connecting parts, the scan signal being supplied from the second scan driver SDV2 and the scan signal being supplied from the third scan driver SDV3 are supplied such that they are synchronized to each other.

In addition, the second scan driver SDV2 and the third scan driver SDV3 may be driven such that they are synchronized to each other, and, accordingly, the second scan driver SDV2 and the third scan driver SDV3 may be driven by the same gate control signal GCS. For example, the third gate control signal GCS3 being supplied to the third scan driver SDV3 may be set as the same signal as the second gate control signal GCS2.

The first light emission driver EDV1 supplies a light emission control signal to the first light emission control lines E11 to E1n in response to a fourth gate control signal GCS4 from the timing control unit TC. For example, the first light emission driver EDV1 may supply the light emission control signal to the first light emission control lines E11 to E1n sequentially.

Here, the light emission control signal may be set to have a greater width than the scan signal. For example, the light emission control signal being supplied to an i-th (i being a natural number) first light emission control line E1i may be supplied such that it is overlapped with the scan signal being supplied to an i-1th first scan line S1i-1 and the scan signal being supplied to an i-th first scan line S1i for at least a partial period of time.

The second light emission driver EDV2 supplies a light emission control signal to the second light emission control lines E21, E22 in response to a fifth gate control signal GCS5 from the timing control unit TC. The second light emission control driver EDV2 may supply the light emission control signal to the second light emission control lines E21, E22 sequentially.

The third light emission driver EDV3 supplies the light emission control signal to the third light emission control lines E31, E32 in response to a sixth gate control signal GCSE from the timing control unit TC. The third light emission driver EDV3 may supply the light emission control signal to the third light emission control lines E31, E32 sequentially.

In addition, the light emission control signal may be set to a gate off voltage (for example, high voltage) such that a transistor included in the pixels PXL may be turned-off, and the scan signal may be set to a gate on voltage (for example, low voltage) such that the transistor included in the pixels PXL may be turned-on.

In an embodiment, the light emission control signal being supplied from the second light emission driver EDV2 to the second light emission control line E21 may be supplied at the same time as the light emission control signal being supplied from the third light emission control driver EDV3 to the third light emission control line E31. Likewise, the light emission control signal being supplied from the second light emission driver EDV2 to the second light emission control line E22 may be supplied at the same time as the light emission control signal being supplied from the third light emission driver EDV3 to the third light emission control line E32.

In an embodiment, the second light emission driver EDV2 and the third light emission driver EDV3 may be driven such that they are synchronized to each other, and, accordingly, the second light emission driver EDV2 and the third light emission driver EDV3 may be driven by the same gate control signal GCS. For example, the sixth gate control signal GCS6 being supplied to the third light emission driver EDV3 may be set as the same signal as the fifth gate control signal GCS5.

The data driver DDV may supply a data signal to the data lines D1 to Dm in response to the data control signal DCS. The data signal supplied to the data lines D1 to Dm is supplied to the pixels PXL selected by the scan signal.

The timing control unit TC supplies the gate control signals GCS1 to GCS6 generated based on the timing signals being supplied from outside to the scan drivers SDV and the light emission drivers EDV, and the data control signal DCS to the data driver DDV.

Each of the gate control signals GCS1 to GCS6 includes a start pulse and clock signals. The start pulse controls the timing of the first scan signal or the first light emission control signal. The clock signals are used to shift the start pulse.

The data control signal DCS includes a source start pulse and clock signals. The source start pulse controls the starting time point of the sampling of the data. The clock signals are used to control the sampling operation.

In an embodiment, when the display device is being driven sequentially, the first scan driver SDV1 may be provided with a last output signal of the second scan driver SDV2 as the start pulse. Likewise, when the display device is being driven sequentially, the first light emission driver EDV1 may be provided with the last output signal of the second light emission driver EDV2 as the start pulse.

A load matching capacitor LMCAP may be connected to the scan lines S21, S22, S31, and S32 and the emission control lines E21, E22, E31, and E32 arranged in the second and third areas A2 and A3. The load matching capacitor LMCAP may be formed corresponding to each of the scan lines and the emission control lines. Each of the load matching capacitors LMCAP may include an electrode connected to the scan line or the emission control line and another electrode connected to the first power source ELVDD.

Figure 3:
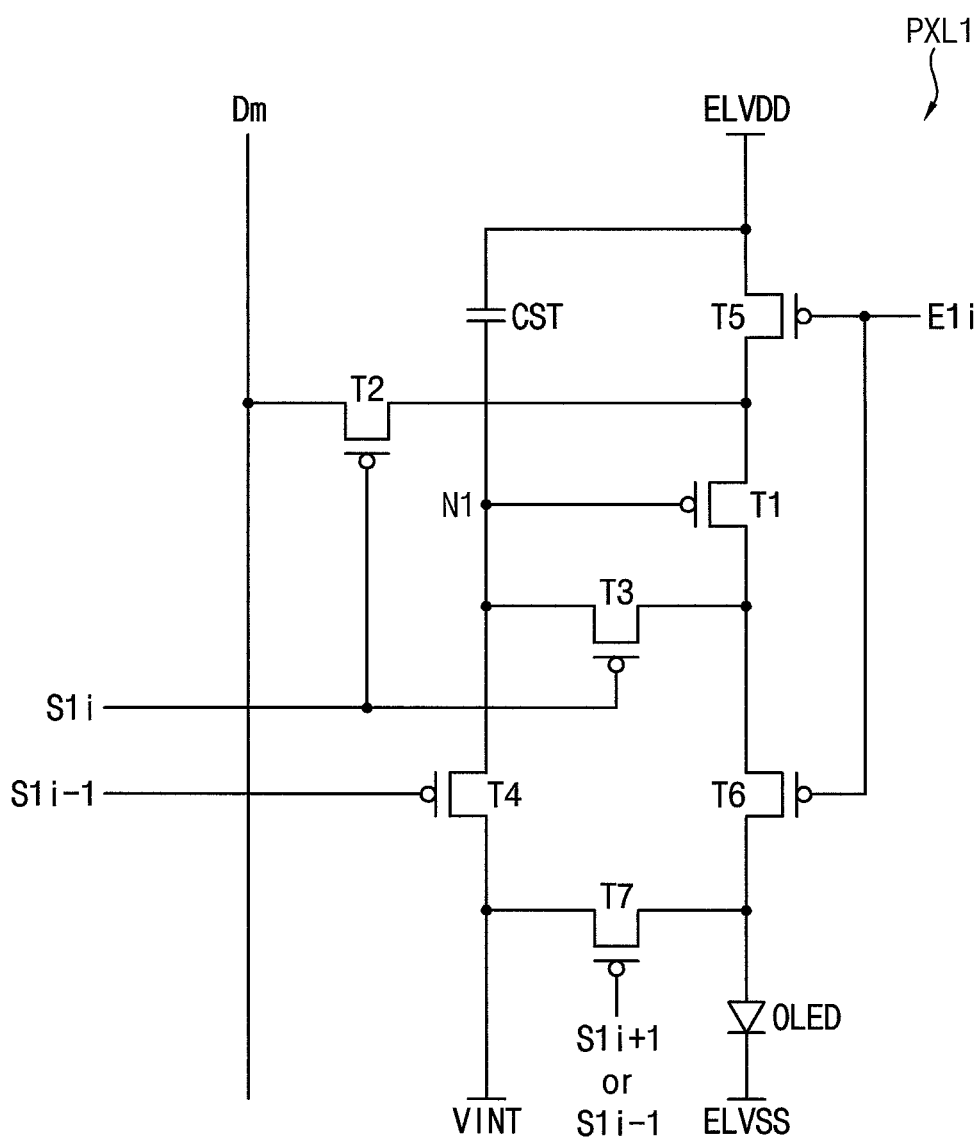
FIG. 3 is a view illustrating an embodiment of a first pixel shown in FIG. 2.

FIG. 3 is a view illustrating an embodiment of the first pixel shown in FIG. 2.

In FIG. 3, for convenience of explanation, a pixel accessed to an m-th data line Dm and an i-th first scan line S1$i$ is illustrated.

Referring to FIG. 3, the first pixel PXL1 according to an embodiment of the present disclosure is provided with an organic light emitting diode OLED, first to seventh transistors T1 to T7, and a storage capacitor CST.

An anode of the organic light emitting diode OLED is accessed to the first transistor T1 via the sixth transistor T6, and a cathode of the organic light emitting diode OLED is accessed to the second power source ELVSS. Such an organic light emitting diode OLED generates light of a certain brightness that corresponds to the amount of current being supplied from the first transistor T1.

The first power source ELVDD may be set to a higher voltage than the second power source ELVSS such that current may flow to the organic light emitting diode OLED.

The seventh transistor T7 is accessed between an initializing power source VINT and the anode of the organic light emitting diode OLED. Further, the gate electrode of the seventh transistor T7 is accessed to the i-th first scan line S1$i$. Such a seventh transistor T7 is turned-on when the scan signal is being supplied to the i-th first scan line S1$i$, and provides the voltage of the initializing power source VINT to the anode of the organic light emitting diode OLED. Here, the initializing power source VINT may be set to a lower voltage than the data signal.

The sixth transistor T6 is accessed between the first transistor T1 and the organic light emitting diode OLED. Further, the gate electrode of the sixth transistor T6 is accessed to the i-th first light emission control line E1$i$. Such a sixth transistor T6 is turned-off when the light emission control signal is supplied to the i-th first light emission control line E1$i$, and, in other cases, the sixth transistor T6 is turned-on.

The fifth transistor T5 is accessed between the first power source ELVDD and the first transistor T1. Further, a gate electrode of the fifth transistor T5 is accessed to the i-th first light emission control line E1$i$. Such a fifth transistor T5 is turned-off when the light emission control signal is being supplied to the i-th first light emission control line E1$i$, and, in other cases, the fifth transistor T5 is turned-on.

A first electrode of the first transistor T1 (driving transistor) is accessed to the first power source ELVDD via the fifth transistor T5, and a second electrode of the first transistor T1 is accessed to the anode of the organic light emitting diode OLED via the sixth transistor T6. Further, a gate electrode of the first transistor T1 is accessed to a first node N1. Such a first transistor controls the amount of current flowing from the first power source ELVDD to the second power source ELVSS via the organic light emitting diode OLED in response to the voltage of the first node N1.

The third transistor T3 is accessed between the second electrode of the first transistor T1 and the first node N1. Further, a gate electrode of the third transistor T3 is accessed to the i-th first scan line S1$i$. Such a third transistor T3 is turned-on when a scan signal is being supplied to the i-th first scan line S1$i$, and electrically accesses the second electrode of the first transistor T1 and the first node N1.

Therefore, when the third transistor T3 is turned-on, the first transistor T1 is accessed in a diode form.

The fourth transistor T4 is accessed between the first node N1 and the initializing power source VINT. Further, a gate electrode of the fourth transistor T4 is accessed to an i−1th first scan line S1i−1. Such a fourth transistor T4 is turned-on when a scan signal is being supplied to the i−1th first scan line S1i−1, and supplies the voltage of the initializing voltage VINT to the first node N1.

The second transistor T2 is accessed between the m-th data line Dm and the first electrode of the first transistor T1. Further, a gate electrode of the second transistor T2 is accessed to the i-th first scan line S1i. Such a second transistor T2 is turned-on when a scan signal is being supplied to the i-th first scan line S1i, and electrically accesses the m-th data line Dm and the first electrode of the first transistor T1.

The storage capacitor CST is accessed between the first power source ELVDD and the first node N1. Such a storage capacitor CST stores a data signal and a voltage corresponding to a threshold voltage of the first transistor.

In an embodiment, the second pixel PXL2 and the third pixel PXL3 may be realized in a same circuit as the first pixel PXL1. Therefore, detailed explanation on the second pixel PXL2 and the third pixel PXL3 is omitted.

Figure 4:
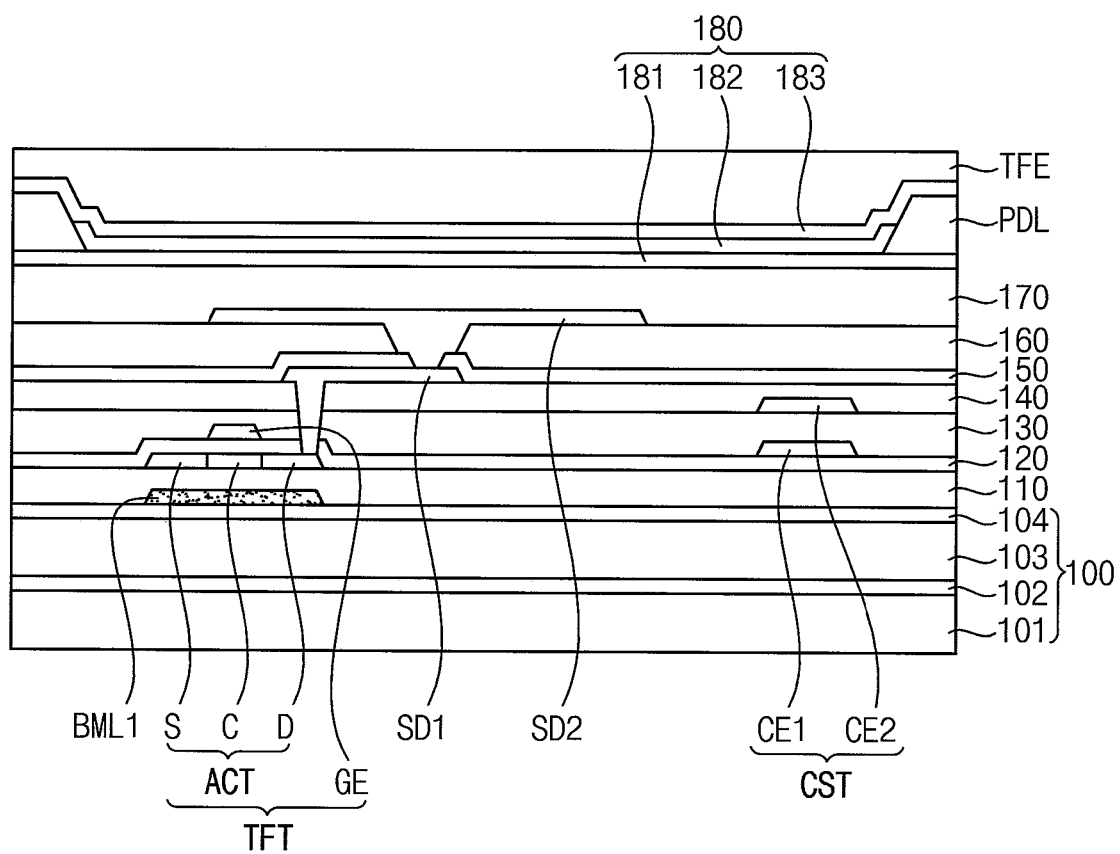
FIG. 4 is a cross-sectional view illustrating a display apparatus in a display area.

FIG. 4 is a cross-sectional view illustrating a display apparatus in a display area.

Referring to FIG. 4, in an embodiment, the display apparatus may include a substrate 100, a lower conductive layer, a buffer layer 110, an active pattern ACT, a first gate insulation layer 120, a first gate conductive layer, a second gate insulation layer 130, a second gate conductive layer, an interlayer insulating layer 140, a first data conductive layer, a first insulation layer 150, a second insulation layer 160, a second data conductive layer, a third insulation layer 170, a pixel defining layer PDL, a light emitting structure 180, and a thin film encapsulation layer TFE.

The substrate 100 including any of transparent or opaque insulation materials may be provided. For example, the substrate 100 may include a quartz substrate, a synthetic quartz substrate, a calcium fluoride substrate, a fluoride-doped quartz substrate, a soda lime glass substrate, a non-alkali glass substrate, etc. Alternatively, the substrate 100 may include a flexible transparent material, such as a flexible transparent resin substrate (e.g., a polyimide substrate). For example, the substrate 100 may include a first polyimide layer 101, a first barrier layer 102 disposed on the first polyimide layer 101, a second polyimide layer 103 disposed on the first barrier layer 102, and a second barrier layer 104 disposed on the second polyimide layer 103.

The lower conductive layer including a protective pattern BML1 may be disposed on the substrate 100. The protective pattern BML1 may be disposed to overlap with the active pattern ACT and work as a protective layer for preventing or substantially preventing degradation of electrical characteristics of the active pattern ACT of the thin film transistor TFT. For example, in the manufacturing process of the display apparatus 100, the thin film transistor TFT may be protected from a laser or moisture flowing from the bottom of the substrate 100 which is a flexible substrate. The protective pattern BML1 may minimize or reduce variation of the threshold voltage of the thin film transistor TFT caused by the laser irradiated through the substrate 100 into the active pattern ACT of the thin film transistor TFT. The lower conductive layer may be formed of a metal having a low light transmittance. For example, the lower conductive layer may include molybdenum (Mo).

In an embodiment, the buffer layer 110 may be disposed entirely on the substrate 100 on which the lower conductive layer is disposed. The buffer layer 110 may prevent or substantially prevent the diffusion of metal atoms and/or impurities from the substrate 100 into the active pattern ACT. In addition, the buffer layer 110 may control a rate of heat transfer in a crystallization process for forming the active pattern ACT, thereby obtaining substantially uniform the active pattern ACT.

The active pattern ACT may be disposed on the buffer layer 110. In an embodiment, the active pattern ACT may include amorphous silicon or polycrystalline silicon. In some example embodiments, the active pattern ACT may include oxide of at least one substance selected from the group consisting of indium (In), gallium (Ga), tin (Sn), zirconium (Zr), vanadium (V), hafnium (Hf), cadmium (Cd), germanium (Ge), chromium (Cr), titanium (Ti), and zinc (Zn). The active pattern ACT may include a channel region and a source region and a drain region doped with an impurity.

The first gate insulation layer 120 may be disposed on the buffer layer 110. The first gate insulation layer 120 may be uniformly formed on the buffer layer 110 along a profile of the active pattern ACT. The first gate insulation layer 120 may include a silicon compound, metal oxide, etc. In an embodiment, the first gate insulation layer 120 may be formed of a plurality of layers.

The first gate conductive layer including a scan line, a gate electrode GE, and a first storage electrode CE may be disposed on the first insulating layer 120. The gate electrode GE may overlap with the active pattern ACT. The first gate conductive layer may be formed using a metal, an alloy, a metal nitride, a conductive metal oxide, a transparent conductive material, or the like.

The second gate insulation layer 130 may be disposed on the first gate insulation layer 120 on which the first gate conductive layer is disposed. For example, the second gate insulation layer 130 may be uniformly formed on the first gate insulation layer 120 along a profile of the first gate conductive layer. Here, the second gate insulation layer 130 may have a substantially small thickness, such that a stepped portion may be formed at a portion of the second gate insulation layer 130 adjacent to the first gate conductive layer. In some example embodiments, the second gate insulation layer 130 may have a relatively large thickness for sufficiently covering the first gate conductive layer, such that the second gate insulation layer 130 may have a substantially level surface. The second gate insulation layer 130 may include a silicon compound, a metal oxide, or the like. In an embodiment, the second gate insulation layer 130 may be formed of a plurality of layers.

The second gate conductive layer including a second storage electrode CE2 may be disposed on the second gate insulation layer 130. The second storage electrode CE2 may overlap the first storage electrode CE1 to form a storage capacitor. The second gate conductive layer may be formed using a metal, an alloy, a metal nitride, a conductive metal oxide, a transparent conductive material, or the like.

The interlayer insulation layer 140 may be disposed on the second gate insulation layer 130 on which the second gate conductive layer is disposed. For example, the interlayer insulation layer 140 may have a relatively large thickness for sufficiently covering the second gate conductive layer, such that the interlayer insulation layer 140 may have a substantially level surface. In some example embodiments, the interlayer insulation layer 140 may be uniformly formed on the second gate insulation layer 130 along a profile of the second gate conductive layer. In an embodiment, the interlayer insulation layer 140 may be formed of a plurality of layers.

The first data conductive layer may be disposed on the interlayer insulation layer 140. The first data conductive layer may be formed using a metal, an alloy, a metal nitride, a conductive metal oxide, a transparent conductive material, or the like. The first data conductive layer may include a first source drain pattern SD1 electrically connected to the active pattern ACT through a contact hole formed through the first gate insulation layer 120, the second gate insulation layer 130, and the interlayer insulation layer 140, and a data line.

The active pattern ACT and the gate electrode GE may be included in a thin film transistor TFT. For example, the thin film transistor TFT may be any one of the transistors described with respect to FIG. 3.

The first insulation layer 150 may be disposed on the interlayer insulation layer 140 on which the second data pattern is disposed. The first insulation layer 150 may be formed using an inorganic material such as a silicon compound, a metal, or a metal oxide.

The second insulation layer 160 may be disposed on the first insulation layer 150. The second insulation layer 160 may have a single-layered structure or a multi-layered structure including at least two insulation films. In an embodiment, the second insulation layer 160 may be formed using an organic material. For example, the second insulation layer 160 may include photoresist, acryl-based resin, polyimide-based resin, polyamide-based resin, siloxane-based resin, etc.

The second data conductive layer, which includes a second source drain pattern SD2 electrically connected to the first source drain pattern SD1 through a contact hole formed through the first insulation layer 150 and the second insulation layer 160, may be disposed on the second insulation layer 160.

The third insulation layer 170 may be disposed on the second insulation layer 160 on which the second data conductive layer is disposed. The third insulation layer 170 may have a single-layered structure or a multi-layered structure including at least two insulation films. In an embodiment, the third insulation layer 170 may be formed using an organic material. For example, the third insulation layer 170 may include photoresist, acryl-based resin, polyimide-based resin, polyamide-based resin, siloxane-based resin, etc.

The light emitting structure 180 may include a first electrode 181, an emission layer 182, and a second electrode 183.

The first electrode 181 may be disposed on the third insulation layer 170. The first electrode 181 may be electrically connected to a contact pad through a contact hole formed through the third insulation layer 170.

The first electrode 181 may include a reflective material or a transmissive material in accordance with the emission type of the display apparatus. For example, the first electrode 181 may be formed using aluminum, alloy containing aluminum, aluminum nitride, silver, alloy containing silver, tungsten, tungsten nitride, copper, alloy containing copper, nickel, alloy containing nickel, chromium, chromium nitride, molybdenum, alloy containing molybdenum, titanium, titanium nitride, platinum, tantalum, tantalum nitride, neodymium, scandium, strontium ruthenium oxide, zinc oxide, indium tin oxide, tin oxide, indium oxide, gallium oxide, indium zinc oxide, etc. These may be used alone or in a combination thereof. In example embodiments, the first electrode 181 may have a single-layer structure or a multi-layer structure, which may include a metal film, an alloy film, a metal nitride film, a conductive metal oxide film, and/or a transparent conductive film.

The pixel defining layer PDL may be disposed on the third insulation layer 170 on which the first electrode 181 is disposed. The pixel defining layer PDL may be formed using an organic material. For example, the pixel defining layer PDL may include photoresist, acryl-based resin, polyimide-based resin, polyamide-based resin, siloxane-based resin, etc. In some example embodiments, an opening which exposes the first electrode 181 may be formed by etching the pixel defining layer PDL. An emitting area and a non-emitting area of the display apparatus may be defined by the opening of the pixel defining layer PDL. For example, a portion where the opening of the pixel defining layer PDL is located may correspond to the emitting area, and the non-emitting area may correspond to a portion adjacent to the opening of the pixel defining layer PDL.

The light emitting layer 182 may be disposed on the first electrode 181 exposed through the opening of the pixel defining layer PDL. In addition, the light emitting layer 182 may extend on a sidewall of the opening of the pixel defining layer PDL. In some example embodiments, the light emitting layer 182 may include an organic light emitting layer (EL), a hole injection layer (HIL), a hole transfer layer (HTL), an electron transfer layer (ETL), an electron injection layer (EIL), etc. In some example embodiments, except for the organic emission layer, the hole injection layer, the hole transport layer, the electron transport layer, and the electron injection layer may be formed in common to correspond to a plurality of pixels. In some example embodiments, a plurality of organic light emitting layers may be formed using light emitting materials for generating different colors of light, such as a red color of light, a green color of light, and a blue color of light, in accordance with color pixels of the display device. In some example embodiments, the organic light emitting layer of the light emitting layer 182 may include a plurality of stacked light emitting materials for generating a red color of light, a green color of light, and a blue color of light to thereby emit a white color of light. Here, elements of the light emitting layer 182 are commonly formed so as to correspond to a plurality of pixels, and each pixel can be divided by a color filter layer.

The second electrode 183 may be disposed on the pixel defining layer PDL and the light emitting layer 182. The second electrode 183 may include a transmissive material or a reflective material in accordance with the emission type of the display device. For example, the second electrode 183 may be formed using aluminum, alloy containing aluminum, aluminum nitride, silver, alloy containing silver, tungsten, tungsten nitride, copper, alloy containing copper, nickel, alloy containing nickel, chromium, chromium nitride, molybdenum, alloy containing molybdenum, titanium, titanium nitride, platinum, tantalum, tantalum nitride, neodymium, scandium, strontium ruthenium oxide, zinc oxide, indium tin oxide, tin oxide, indium oxide, gallium oxide, indium zinc oxide, etc. These may be used alone or in a combination thereof. In example embodiments, the second electrode 183 may also have a single-layer structure or a multi-layer structure, which may include a metal film, an alloy film, a metal nitride film, a conductive metal oxide film, and/or a transparent conductive film.

The thin film encapsulation layer TFE may be disposed on the second electrode 183. The thin film encapsulation layer TFE may prevent or substantially prevent penetration of moisture and oxygen from outside. In an embodiment, the thin film encapsulation layer TFE may include at least one organic layer and at least one inorganic layer. The at least one organic layer and the at least one inorganic layer may be alternately stacked with each other. For example, the thin film encapsulation layer TFE may include two inorganic layers and one organic layer therebetween, but is not limited thereto. In some example embodiments, it is possible to provide a sealing substrate for shielding outside air and moisture from penetrating into the display apparatus instead of the thin film encapsulation layer TFE.

Figure 5:
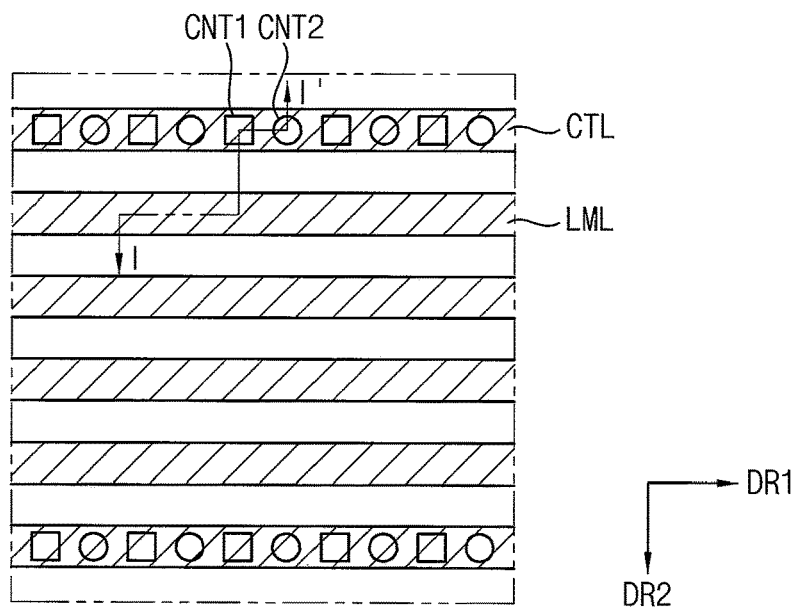
FIG. 5 is a plan view illustrating a region "A" of FIG. 1.
Figure 6:
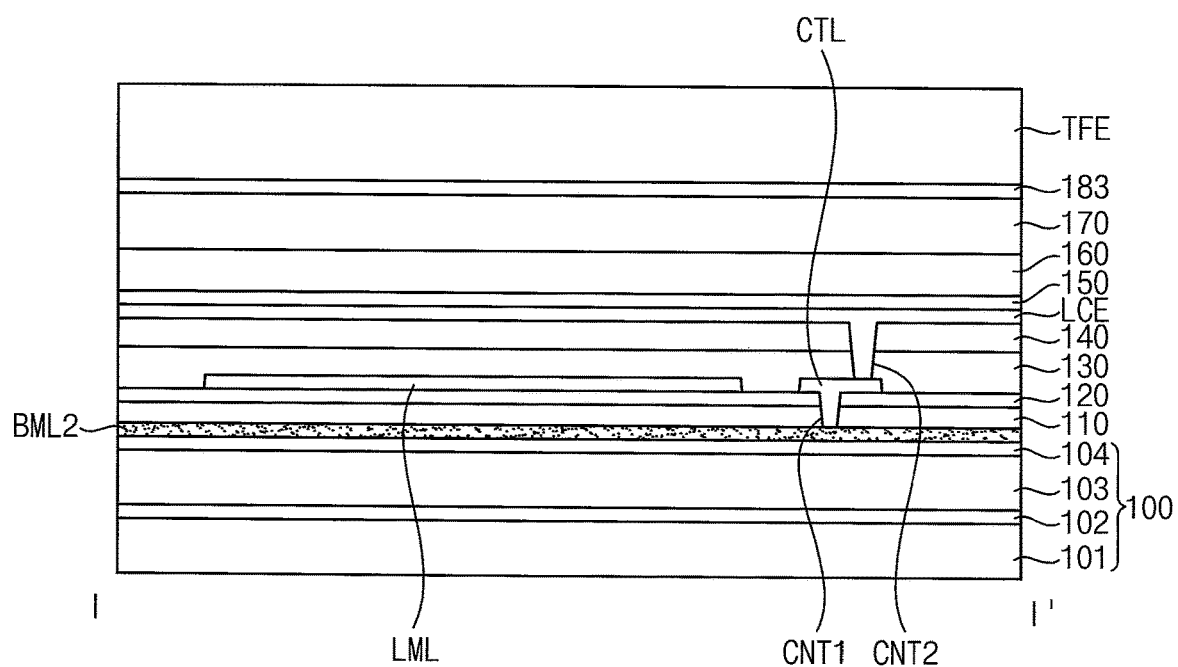
FIG. 6 is a cross-sectional view taken along the line I-I' of FIG. 5.

FIG. 5 is a plan view illustrating a region "A" of FIG. 1; FIG. 6 is a cross-sectional view taken along the line I-I' of FIG. 5; and FIGS. 7A, 7B, 7C, and 7D are plan views illustrating an auxiliary conductive layer, a first contact hole, a first gate conductive layer, and a second contact hole of the display apparatus of FIGS. 5 and 6, respectively.

Referring to FIGS. 1 and 4 to 7D, in the upper second peripheral area PPA2U, the display apparatus may include the substrate 100, the lower conductive layer, the buffer layer 110, the first gate insulation layer 120, the first gate conductive layer, the second gate insulation layer 130, the interlayer insulation layer 140, the first insulation layer 150, the second insulation layer 160, the third insulation layer 170, the second electrode 183, and the thin film encapsulation layer TFE.

The lower conductive layer may further include an auxiliary conductive pattern BML2. The auxiliary conductive pattern BML2 may be for forming a capacitor with the load matching line LML to suitably compensate load of the scan line connected to the load matching line LML. In an embodiment, the auxiliary conductive pattern BML2 may be formed from the same layer as the protective pattern BML1. Therefore, it is possible to compensate the load of the scan line without using a separate additional layer structure by using the lower conductive layer.

The first gate conductive layer may further include the load matching line LML and a connecting line CTL.

The load matching line LML may overlap the auxiliary conductive pattern BML2. The load matching line LML may extend in the first direction DR1. The load matching line LML may be formed for each scan line requiring load compensation. The connecting line CTL may be spaced apart from the load matching line LML. The connecting line CTL may be connected to the auxiliary conductive pattern BML2 through a first contact hole CNT1 formed through the first gate insulating layer 120 and the buffer layer 110. The connecting line CTL may be connected to the load matching electrode LCE through a second contact hole CNT2 formed through the second gate insulation layer 130 and the interlayer insulation layer 140. The first contact hole CNT1 and the second contact hole CNT2 may be arranged so as not to overlap with each other, and a plurality of the contact holes may be alternately arranged along the connecting line CTL.

The first data conductive layer may include the load matching electrode LCE. The load matching electrode LCE may overlap with the load matching line LML to form a capacitor. That is, in order to reduce load deviation of the scan lines, the load matching capacitor corresponding to the scan line which required for load compensation may be formed. The load matching capacitor may include a first load matching capacitor formed by the auxiliary conductive pattern BML2, the load matching line LML, and the insulation layers therebetween, and a second load matching capacitor formed by the load matching line LML, the load matching electrode LCE, and the insulation layers therebetween.

Although the load matching electrode LCE and the auxiliary conductive pattern BML2 are connected through the connecting line CTL in the present embodiment, they may be directly connected to each other or may be connected to each other through a conductive pattern of another layer.

The second electrode 183 may overlap the load matching electrode LCE.

A second power source ELVSS may be applied to the second electrode 183, and a first power source ELVDD may be applied to the auxiliary conductive pattern BML2 and the load matching electrode LCE. In some example embodiments, the second power source ELVSS can be applied to the load matching electrode LCE.

In addition, the load matching capacitor is formed by the auxiliary conductive pattern BML2 and the load matching electrode LCE, such that it has a more stable structure than a case in which the load matching capacitor is formed using the active pattern ACT and the first gate conductive layer. This is because when the load matching capacitor is formed using the active pattern ACT and the first gate conductive layer, a short defect may occur between the active pattern ACT and the first gate conductive layer due to a narrow gap.

On the other hand, in the notch peripheral area NPA, not only the region "A" in FIG. 1, which is a peripheral area adjacent to the notch peripheral area NPA, but also the auxiliary conductive pattern BML2 can be formed for load matching. The display apparatus may have a structure similar to the cross-sectional view shown in FIG. 6.

Figure 8:
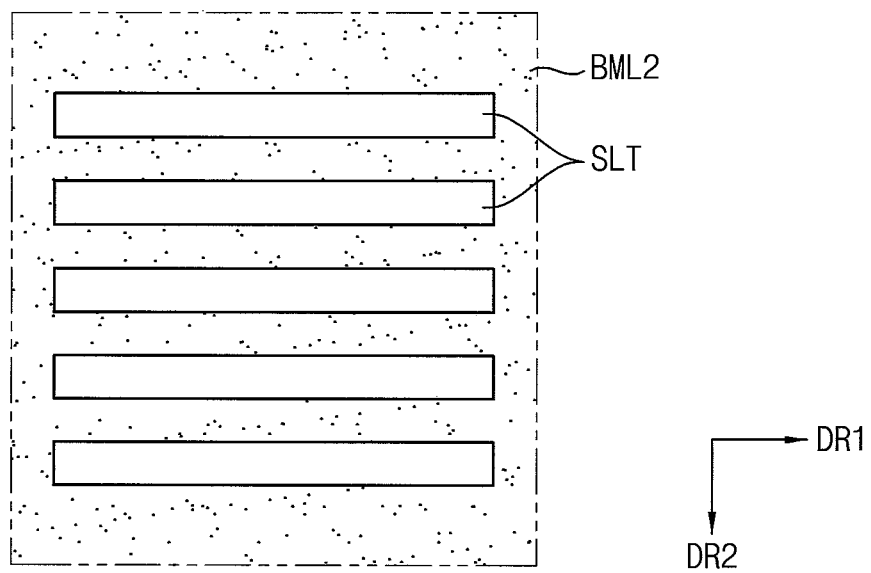
FIG. 8 is a plan view illustrating an auxiliary conductive layer of a display apparatus according to another embodiment of the present invention.

FIG. 8 is a plan view illustrating an auxiliary conductive layer of a display apparatus according to another embodiment of the present invention.

The display apparatus is substantially the same as the display apparatus of FIGS. 1 to 7D except that a plurality of slits SLT is formed in an auxiliary conductive pattern BML2. Therefore, repeated description will be omitted.

In an embodiment, the auxiliary conductive pattern BML2 may be formed with the slits SLT. The slits SLT may be arranged so as not to overlap with a load matching line LML. A connecting line CTL may be arranged so as not to overlap or overlap with the slit SLT.

Figure 7A:
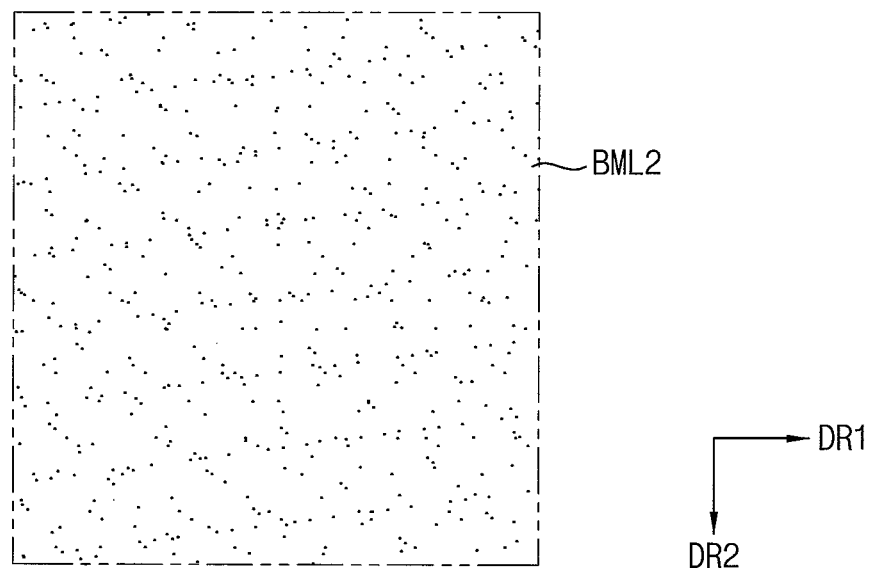
FIGS. 7A, 7B, 7C, and 7D are plan views illustrating an auxiliary conductive layer, a first contact hole, a first gate conductive layer, and a second contact hole of the display apparatus of FIGS. 5 and 6, respectively.
Figure 7B:
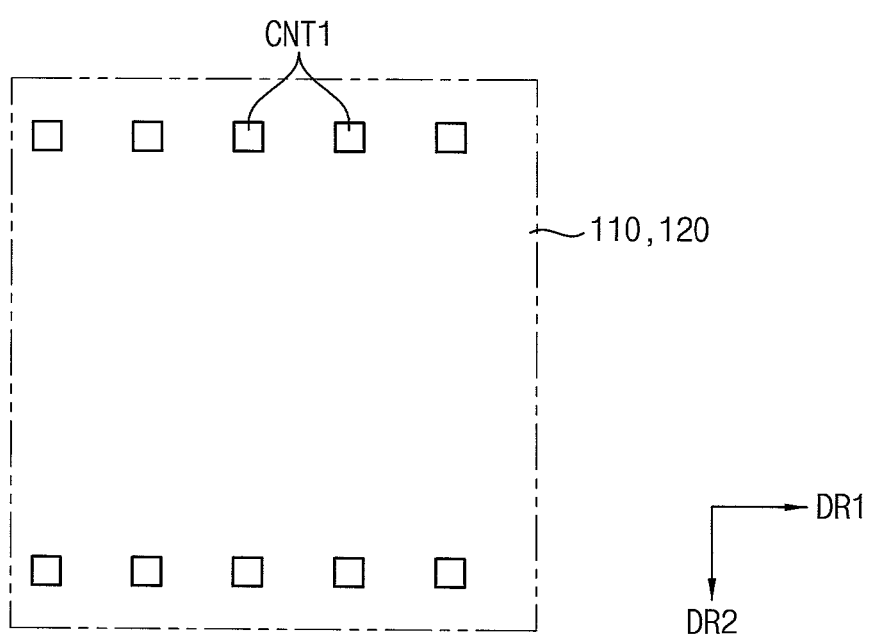
Figure 7C:
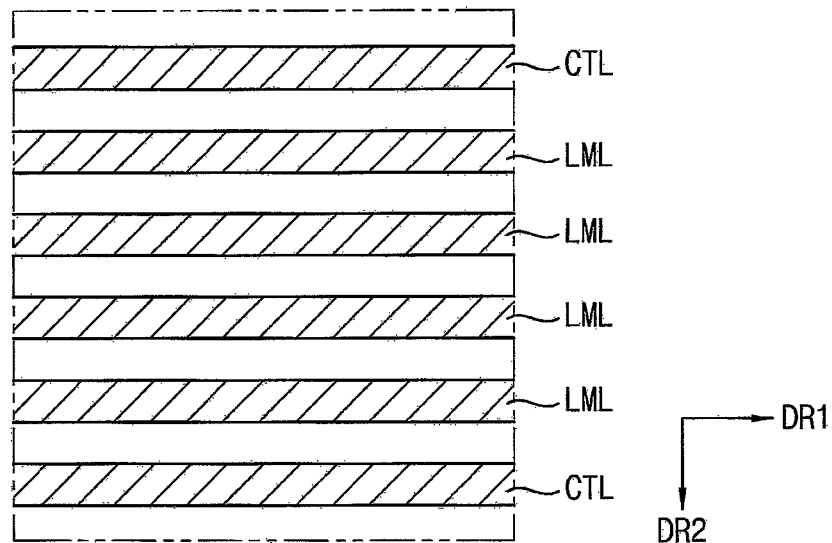
Figure 7D:
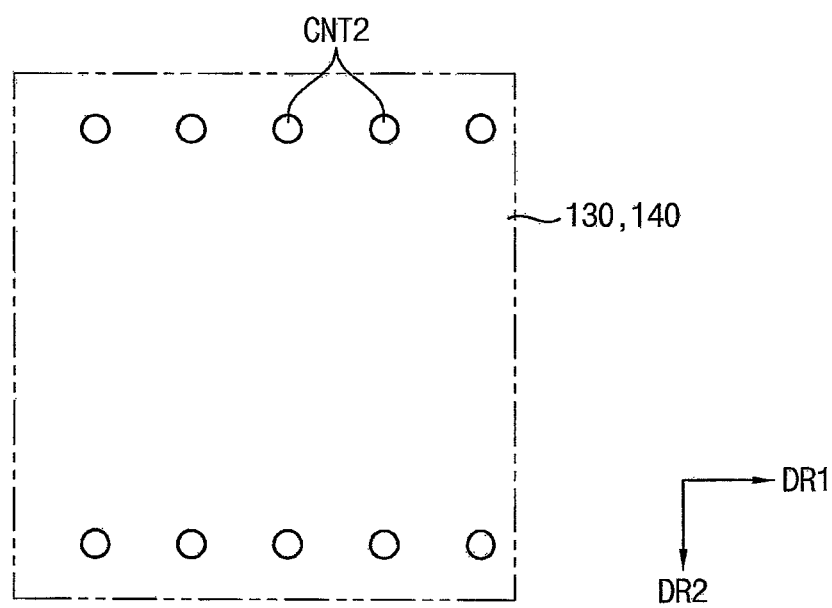

In the embodiment shown in FIG. 7D, the auxiliary conductive pattern has a plate shape. In the embodiment shown in FIG. 8, a slit is formed in the auxiliary conductive pattern. However, the shape of the auxiliary conductive pattern is not limited thereto and can be variously modified.

Figure 9:
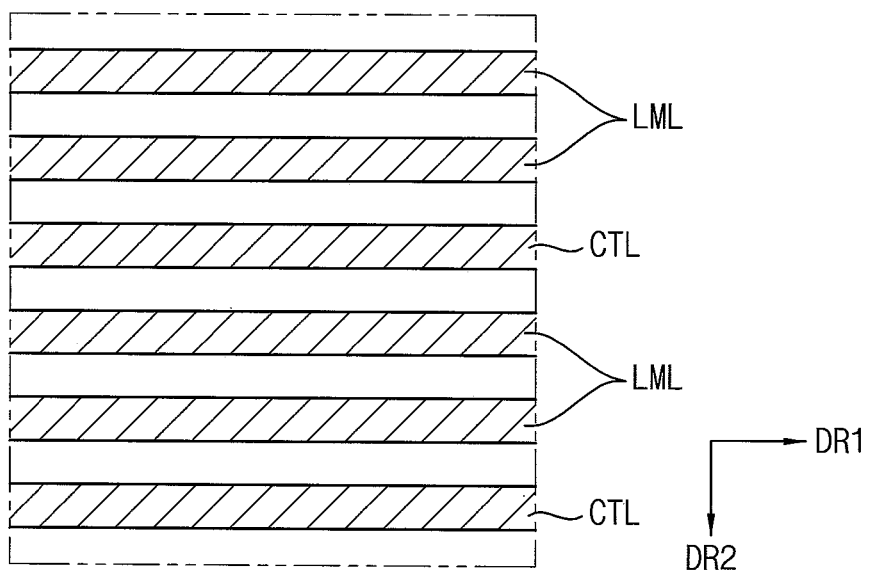
FIG. 9 is a plan view illustrating a first gate conductive layer of a display apparatus according to another embodiment of the present invention.

FIG. 9 is a plan view illustrating a first gate conductive layer of a display apparatus according to another embodiment of the present invention.

The display apparatus is substantially the same as the display apparatus of FIGS. 1 to 7D except for an arrangement of a load matching line LML and the connecting line CTL. Therefore, repeated description will be omitted.

In the embodiment of FIG. 7C, connecting lines are arranged above and below the four load matching lines, respectively. In the embodiment of FIG. 9, one connecting line is arranged for each of the two load matching lines. However, the arrangement and the number of the load matching lines and the connecting lines are not limited thereto and can be variously modified.

According to exemplary embodiments of the present inventive concept, a display apparatus includes a substrate, a lower conductive layer comprising a protective pattern and auxiliary conductive pattern disposed on the substrate, a buffer layer disposed on the lower conductive layer, an active pattern disposed on the buffer layer and overlapping the protective pattern, a first insulation layer disposed on the active pattern, and a first conductive pattern disposed on the first insulation layer, comprising a gate electrode overlapping the active pattern and a load matching line overlapping the auxiliary conductive pattern. Accordingly, since the scan lines and the load matching lines are physically connected and are not connected to each other by contact holes or the like, in the manufacturing process, usage, and the like of the display apparatus, it is possible to provide a structure that minimizes or reduces a variation of characteristics of the thin film transistor and damage caused by static electricity flowing into the active pattern through the contact holes.

In addition, since the load matching capacitor is formed by using the lower conductive layer, possibility of short circuiting with the gate conductive layer can be reduced as compared with a case in which the active layer is used for forming the load matching capacitor.

In addition, since the thin film transistor can be protected by the protective pattern, the display quality of the display apparatus can be improved.

Figure 10:
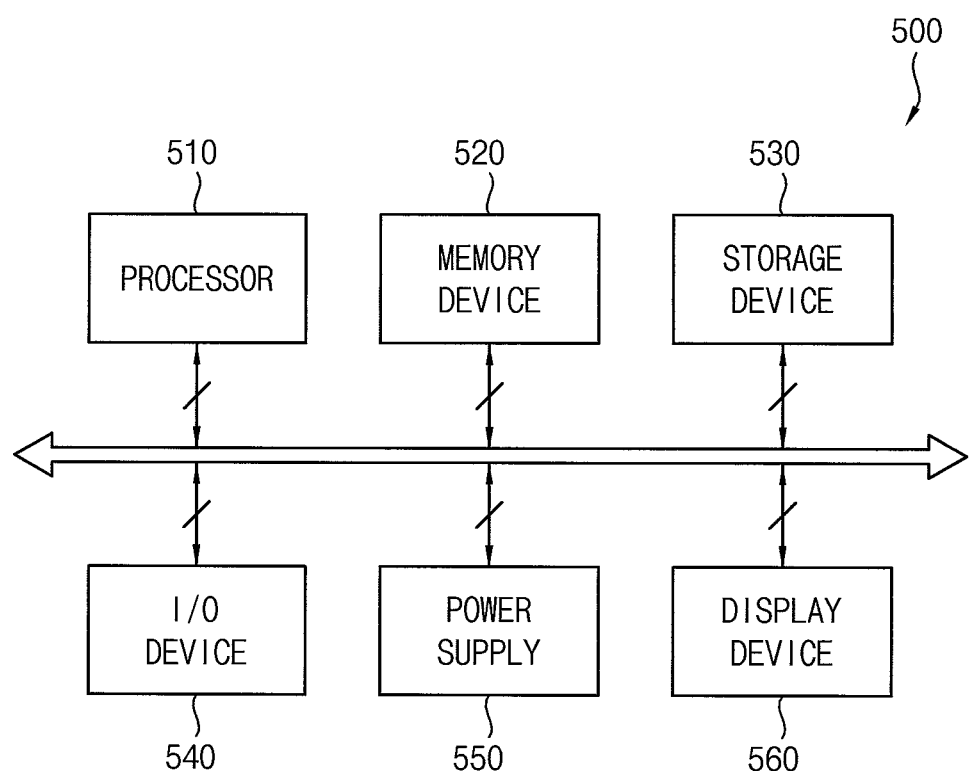
FIG. 10 is a block diagram illustrating an electronic device according to example embodiments.
Figure 11A:
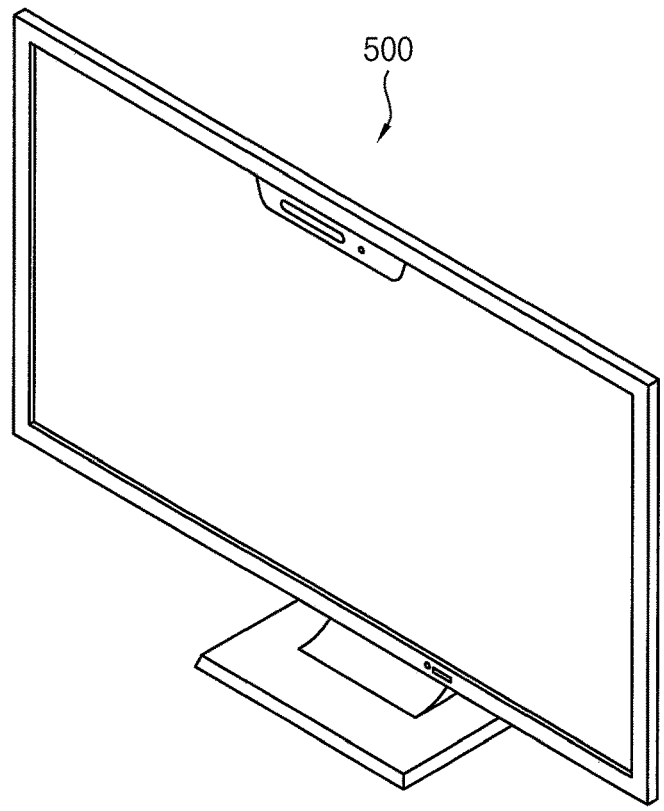
FIG. 11A is a diagram illustrating an example in which the electronic device of FIG. 10 is implemented as a television.

FIG. 10 is a block diagram illustrating an electronic device according to example embodiments; FIG. 11A is a diagram illustrating an example in which the electronic device of FIG. 10 is implemented as a television; and FIG. 11B is a diagram illustrating an example in which the electronic device of FIG. 10 is implemented as a smartphone.

Figure 11B:
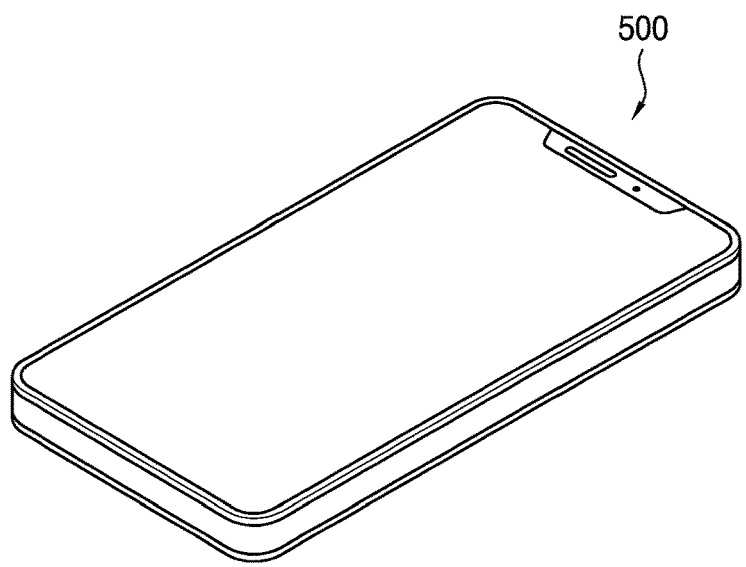
FIG. 11B is a diagram illustrating an example in which the electronic device of FIG. 10 is implemented as a smartphone.

Referring to FIGS. 10 through 11B, the electronic device 500 may include a processor 510, a memory device 520, a storage device 530, an input/output (I/O) device 540, a power supply 550, and a display device 560. Here, the display device 560 may correspond to the display apparatus of FIG. 1. In addition, the electronic device 500 may further include a plurality of ports for communicating with a video card, a sound card, a memory card, a universal serial bus (USB) device, other electronic devices, etc. In an example embodiment, as illustrated in FIG. 11A, the electronic device 500 may be implemented as a television. In another example embodiment, as illustrated in FIG. 11B, the electronic device 500 may be implemented as a smartphone. However, the electronic device 500 is not limited thereto. For example, the electronic device 500 may be implemented as a cellular phone, a video phone, a smart pad, a smart watch, a tablet PC, a car navigation system, a computer monitor, a laptop, a head mounted display (HMD), etc.

The processor 510 may perform various computing functions. The processor 510 may be a microprocessor, a central processing unit (CPU), an application processor (AP), etc. The processor 510 may be coupled to other components via an address bus, a control bus, a data bus, etc. Further, the processor 510 may be coupled to an extended bus, such as a peripheral component interconnection (PCI) bus. The memory device 520 may store data for operations of the electronic device 500. For example, the memory device 520 may include at least one non-volatile memory device, such as an erasable programmable read-only memory (EPROM) device, an electrically erasable programmable read-only memory (EEPROM) device, a flash memory device, a phase change random access memory (PRAM) device, a resistance random access memory (RRAM) device, a nano floating gate memory (NFGM) device, a polymer random access memory (Po RAM) device, a magnetic random access memory (MRAM) device, a ferroelectric random access memory (FRAM) device, etc., and/or at least one volatile memory device, such as a dynamic random access memory (DRAM) device, a static random access memory (SRAM) device, a mobile DRAM device, etc. The storage device 530 may include a solid state drive (SSD) device, a hard disk drive (HDD) device, a CD-ROM device, etc. The I/O device 540 may include an input device, such as a keyboard, a keypad, a mouse device, a touchpad, a touch screen, etc., and an output device, such as a printer, a speaker, etc. The power supply 550 may provide power for operations of the electronic device 500.

The display device 560 may be coupled to other components via the buses or other communication links. In some example embodiments, the display device 560 may be included in the I/O device 540. As described above, the display device 560 may have a notch-formed display area including areas having different surface areas, and may have a uniform brightness irrespective of the area. However, since this has been described above, a duplicate description thereof is omitted.

The present inventive concept may be applied to a display device and an electronic device including the display device. For example, the present inventive concept may be applied to a cellular phone, a smartphone, a video phone, a smart pad, a smart watch, a tablet PC, a car navigation system, a television, a computer monitor, a laptop, a head mounted display, etc.

The foregoing is illustrative of the inventive concept and is not to be construed as limiting thereof. Although a few exemplary embodiments of the inventive concept have been described, those skilled in the art will readily appreciate that many modifications are possible in the exemplary embodiments without materially departing from the novel teachings and aspects of the inventive concept. Accordingly, all such modifications are intended to be included within the scope of the inventive concept as set forth in the claims. In the claims, means-plus-function clauses are intended to cover the structures described herein as performing the recited function and not only structural equivalents but also equivalent structures. Therefore, it is to be understood that the foregoing is illustrative of the inventive concept and is not to be construed as limited to the specific exemplary embodiments disclosed, and that modifications to the disclosed exemplary embodiments, as well as other exemplary embodiments, are intended to be included within the scope of the appended claims. The inventive concept is defined by the following claims, with equivalents of the claims to be included therein.

What is claimed is:
1. A display apparatus, comprising:
a substrate comprising a pixel area and a peripheral area which is a non-display area and is adjacent to the pixel area;
a lower conductive layer comprising a protective pattern disposed in the pixel area and an auxiliary conductive pattern disposed in the peripheral area on the substrate;
a buffer layer on the lower conductive layer;
an active pattern on the buffer layer and overlapping the protective pattern;
a first insulation layer on the active pattern;
a first scan line extending in a first direction in the pixel area;
a second scan line extending in the first direction in the pixel area and having a length less than the first scan line; and
a first conductive layer on the first insulation layer, the first conductive layer comprising a gate electrode overlapping the active pattern in the pixel area and a load matching line overlapping the auxiliary conductive pattern in the peripheral area and electrically connected to the second scan line.

2. The display apparatus of claim 1, further comprising:
an interlayer insulation layer on the first conductive layer; and a second conductive layer on the interlayer insulation layer, the second conductive layer comprising a load matching electrode which overlaps the load matching line.

3. The display apparatus of claim 2, wherein the first conductive layer further comprises a connecting line extending in the first direction and spaced apart from the load matching line in a second direction crossing the first direction.

4. The display apparatus of claim 3, wherein the connecting line is electrically connected to the auxiliary conductive pattern through a first contact hole formed through the first insulation layer and the buffer layer, and electrically connected to the load matching electrode through a second contact hole formed through the interlayer insulation layer.

5. The display apparatus of claim 4, wherein the first contact hole and the second contact hole do not overlap each other.

6. The display apparatus of claim 4, wherein the first contact hole comprises a plurality of first contact holes spaced apart from each other in the first direction, and the second contact hole comprises a plurality of second contact holes alternately arranged with the first contact holes.

7. The display apparatus of claim 2, wherein the auxiliary conductive pattern, the load matching line, and layers therebetween form a first load matching capacitor, and
the load matching line, the load matching electrode, and layers therebetween form a second load matching capacitor.

8. The display apparatus of claim 2, wherein the first conductive layer further comprises a first storage electrode,
wherein the display apparatus further comprises:
a second insulation layer on the first conductive layer; and
a third conductive layer on the second insulation layer, the third conductive layer comprising a second storage electrode which overlaps the first storage electrode.

9. The display apparatus of claim 8, further comprising:
a third insulation layer on the first conductive layer; and
a light emitting structure on the third insulation layer, the light emitting structure comprising a first electrode, a second electrode facing the first electrode, and a light emitting layer between the first electrode and the second electrode.

10. The display apparatus of claim 9, wherein the second electrode overlaps the load matching electrode.

11. The display apparatus of claim 9, wherein a second power source is applied to the second electrode, and
a first power source is applied to the auxiliary conductive pattern and the load matching electrode.

12. The display apparatus of claim 1, wherein the substrate comprises:
at least one polyimide layer; and
at least one barrier layer.

13. The display apparatus of claim 1, wherein the lower conductive layer comprises molybdenum.

14. The display apparatus of claim 1, wherein the auxiliary conductive pattern comprises a slit.

15. A display apparatus, comprising:
a substrate;
a lower conductive layer comprising a protective pattern and an auxiliary conductive pattern on the substrate;
a buffer layer on the lower conductive layer;
an active pattern on the buffer layer and overlapping the protective pattern;
a first insulation layer on the active pattern;
a first conductive layer on the first insulation layer, the first conductive layer comprising a gate electrode overlapping the active pattern and a load matching line overlapping the auxiliary conductive pattern;
an interlayer insulation layer on the first conductive layer; and
a second conductive layer on the interlayer insulation layer, the second conductive layer comprising a load matching electrode which overlaps the load matching line,
wherein the first conductive layer further comprises a connecting line spaced apart from the load matching line,
wherein the substrate comprises a first pixel area, a second pixel area connected to the first pixel area and having a smaller size than the first pixel area, a first peripheral area which is a non-display area and is adjacent to the first pixel area, and a second peripheral area which is a non-display area and is adjacent to the second pixel area, and
wherein the load matching line comprises a plurality of load matching lines corresponding to gate lines in the second pixel area, and
the connecting line comprises a plurality of connecting lines.

16. A display apparatus, comprising:
a substrate;
a lower conductive layer comprising a protective pattern and an auxiliary conductive pattern on the substrate;
a buffer layer on the lower conductive layer;
an active pattern on the buffer layer and overlapping the protective pattern;
a first insulation layer on the active pattern; and
a first conductive layer on the first insulation layer, the first conductive layer comprising a gate electrode overlapping the active pattern and a load matching line overlapping the auxiliary conductive pattern,
wherein the substrate comprises a first pixel area, a second pixel area connected to the first pixel area and having a smaller size than the first pixel area, a first peripheral area which is a non-display area and is adjacent to the first pixel area, and a second peripheral area which is a non-display area and is adjacent to the second pixel area, and
wherein the auxiliary conductive pattern and the load matching line are in the second peripheral area,
the active pattern and the gate electrode constitute a thin film transistor, and
the thin film transistor is in the second pixel area.

17. The display apparatus of claim 16, wherein the second pixel area is adjacent to an upper side of the first pixel area, and the second peripheral area comprises an upper second peripheral area located adjacent to an upper side of the second pixel area,
wherein the load matching line is in the upper second peripheral area.

18. The display apparatus of claim 17, wherein the first conductive layer further comprises a gate line, and
the load matching line is physically connected to the gate line.

19. The display apparatus of claim 16, wherein the substrate further comprises a third pixel area which is spaced apart from the second pixel area and connected to the first pixel area and has a smaller size than the first pixel area, and a third peripheral area which is a non-display area adjacent to the third pixel area,
wherein a notch is formed between the second pixel area and the third pixel area.

20. A display apparatus, comprising:
- a substrate comprising a pixel area and a peripheral area which is a non-display area and is adjacent to the pixel area;
- a lower conductive layer comprising a protective pattern and an auxiliary conductive pattern on the substrate;
- a buffer layer on the lower conductive layer;
- an active pattern on the buffer layer and overlapping the protective pattern;
- a first insulation layer on the active pattern; and
- a first conductive layer on the first insulation layer, the first conductive layer comprising a gate electrode overlapping the active pattern in the pixel area and a load matching line and a connecting line overlapping the auxiliary conductive pattern in the peripheral area, each of the load matching line and the connecting line extending along an upper surface of the first insulation layer.

* * * * *